United States Patent [19]

Cooper

[11] 4,151,464

[45] Apr. 24, 1979

[54] INTEGRATING VOLTAGE TO FREQUENCY CONVERTER AND MEMORY DECODER

[75] Inventor: Edward Cooper, San Diego, Calif.

[73] Assignee: Power-Science, Inc., San Diego, Calif.

[21] Appl. No.: 781,570

[22] Filed: Mar. 28, 1977

[51] Int. Cl.² ................. G01R 19/16; G01R 19/26
[52] U.S. Cl. ............................ 324/103 P; 324/102; 324/111; 324/120; 340/347 AD
[58] Field of Search ............ 324/102, 120, 111, 99 D, 324/103 P; 340/347 AD

[56] References Cited

U.S. PATENT DOCUMENTS

| | | | |
|---|---|---|---|
| 3,350,574 | 10/1967 | James | 324/120 |
| 4,006,413 | 2/1977 | Silberberg | 324/102 |

Primary Examiner—Rudolph V. Rolinec
Assistant Examiner—Ernest F. Karlsen
Attorney, Agent, or Firm—Brown & Martin

[57] ABSTRACT

A circuit for determining on a half-wave cycle basis the maximum and minimum voltages of input cyclic line voltages for selected time periods in which the line voltages are rectified to half-waves, and an integrating voltage to frequency converter provides output pulses proportional to the voltage magnitudes of the half-waves with the pulses being counted and placed in a memory and then compared with minimum and maximum previous counts for previous half-waves, to provide an updated minimum and maximum voltage for such half-waves over a period of time or period of half-waves, with provisions for providing resetting strobe pulses at zero voltages of the half-waves and for providing accurate measuring of the pulse outputs in the integrating voltage to frequency converter by modulating the integrator sense voltage and achieving substantially accurate compensation for the effects of timing errors in the V/F converter.

22 Claims, 3 Drawing Figures

INTEGRATING VOLTAGE TO FREQUENCY CONVERTER AND MEMORY DECODER

BACKGROUND OF THE INVENTION

Modern computers and electronic instrumentation demand relatively stable AC input power in order to operate dependably. The power supplied by the utility companies is usually not adequate in this regard for sophisticated electronic applications. Typical problems are overvoltage and undervoltage transients, brownouts and short term drop-outs. There are many different types of line regulators available to correct for those power line problems. The most advanced regulator systems are known as uninterruptable power systems, and the cost of these systems is sometimes larger than the equipment being regulated.

The systems designer is faced with the problem of determining the power line conditions and problems that prevail at an installation site in order to select a suitable regulator system. There is almost no instrumentation available to make meaningful line voltage measurements when many systems cannot even tolerate line transients of as short as one half cycle duration. Low cost meters use an averaging measurement technique that requires several cycles for a measurement. So since the designer has no equipment to measure the fast line transients, his only choice is to try various types of regulators until he finds a system that works for his application. This is most frustrating exercise, it is very costly and time consuming, and very often an expensive uninterruptable power system is specified because there was no instrumentation to measure the transients in the AC power in the power line.

The most common line voltage monitors are averaging types with slow responding, galvanometer strip chart recorders. These recorder systems are often useless for this purpose since they cannot respond to half cycle or one cycle transients. The half cycle transients are the most important parameters which the systems designer must know.

The most practical and meaningful measurement technique for AC voltages with large amounts of noise and distortion (typical AC line voltage) is the integrating technique. There are many solid state, integrated circuits available for voltage controlled oscillators, integrating voltage-to-frequency converters and similar circuits. These devices are designed for DC-controlled feedback loops, phase-locked loops and similar applications where only a limited control range is required, and where absolute accuracy is not of prime importance.

Therefore, a measurement system is needed which is capable of analyzing each half cycle of an AC voltage, and that can process accurately each measurement and record, or store in memory the worst case conditions over an extended period of time.

SUMMARY OF THE INVENTION

In an illustrative embodiment of this invention, measurements of the maximum and minimum voltages of input cyclic line voltages are made on a half wave basis. The input line voltage is rectified into half-waves, and the half-waves are then fed an integrating voltage to frequency converter that provides output pulses proportional to the voltage magnitude of the half-waves. The integrating circuit is an integrating resistance network and integrating capacitor. A voltage to frequency converter senses the charge in the capacitor through a pick-off contact in the resistance network. When a sufficient charge on the capacitor is detected, then a discharge circuit is closed that discharges the capacitor back through the resistance network to ground. This discharge continues to a given level at which time the discharge circuit is opened and the capacitor is recharged in the cyclic operation. The charging and discharging of the capacitor occurs several times for each half-cycle, providing output pulses, the number of which are proportional to the input voltage.

To correct deficiencies in known voltage to frequency converters, a correction voltage is applied to the pick-off voltage so that there is a lead in the discharge of the capacitor to correct for time delays in operation of the circuit. Also a zero voltage condition in the half-wave cycle is sensed by a sync circuit that also discharges the capacitor to a given start level so that the capacitor has a known level of charge at the start of each half cycle.

The output of the frequency converter is counted in a counter which count is stored in a memory. The output count for each half cycle is compared in a minimum count memory, maximum count memory-magnitude comparator circuit arrangement wherein comparisons are made with past stored minimum and maximum counts, so that over a given period of time the maximum or minimum counts are held in memory for a given run. Thus the system is updated for each half cycle, providing half cycle detection memory and readout.

To provide a display, a sequence circuit is used that periodically interrogates the minimum and maximum memory systems to readout the particular stored count, which may be displayed or recorded on a time sequencing strip recorder. At these times, the memory systems are reset to accept a new run of data. Thus the system is capable of providing on time sequenced basis, the minimum and maximum readings as well as the instantaneous readings of minimum and maximum line voltage conditions that were detected accurately on a half cycle basis. Voltage transients, which affect sophisticated electronic equipment, are thus accurately detected.

It is therefore an object of this invention to provide a new and improved and yet simplified means for determining on a half cycle basis the maximum and minimum voltages of input cyclic line voltages, and the detection of over voltage and under voltage transients, brownouts and short term drop outs.

Other objects and many advantages of this invention will become more apparent upon a reading of the following detailed description and an examination of the drawings, wherein like references numerals designate like parts through and in which, FIG. 1 is a schematic diagram of the AC integrator circuit and voltage to frequency converter.

Figure 1:
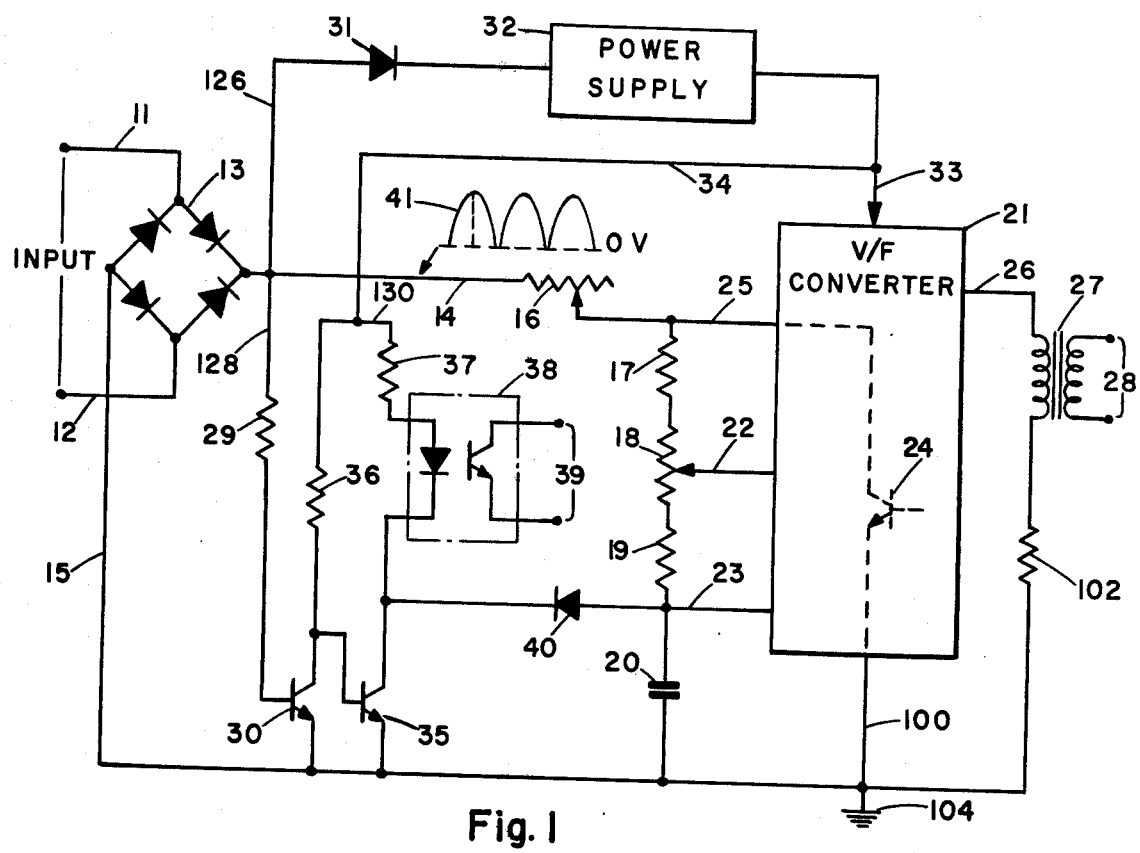

Referring now to FIG. 1, an AC input voltage is fed via lines 11 and 12 to a rectifier circuit 13. The output of the rectifier circuit 13 feeds half-waves of the voltage 41 to lines 14, 126 and 128. The unknown input voltage or control voltage thus causes a charging current that passes through potentiometer 16, resistor 17, potentiometer 18 and resistor 19, forming an integrating resistance network, to an integrating capacitor 20. This charges capacitor 20. Lines 22, 23, and 25 feed pick-off voltages from the integrating resistance network and capacitor circuit to the voltage to frequency (V/F) converter 21. The V/F converter 21 functions to detect charge levels in capacitor 20 and when a given charge level is detected, then to close switch 24, thus discharging capacitor 20 through the resistance network of resistances 17, 18 and 19, through line 100 to ground 104. Line 23 detects the charge on capacitor 20 and functions in the V/F converter circuit to open switch 24 when the charge on capacitor 20 reaches a given low set value.

Figure 2:
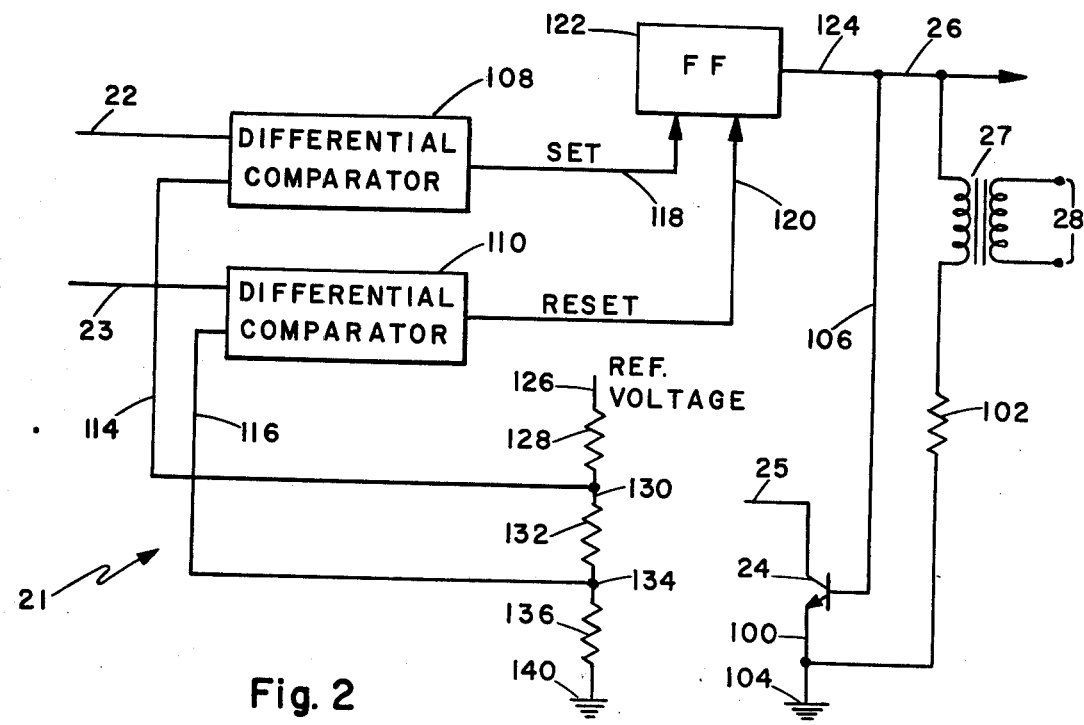
FIG. 2 is a schematic diagram of the voltage to frequency converter circuit.

Referring to FIG. 2, there is illustrated a V/F converter circuit 21. In this circuit 21, the input instantaneous voltages on lines 22 and 23 are fed to respective differential comparators 108 and 110. These instantaneous voltages are compared with a reference voltage fed to differential comparators 108 and 110 by respective lines 114 and 116. A set reference voltage 126 feeds a standard voltage through resistances 128, 132, and 136 to ground 140, providing a voltage drop across the respective resistors providing, for example, $\frac{2}{3}$ of the references voltage on line 130 and 114, and $\frac{1}{3}$ of the reference voltage 126 on lines 116 and 134.

When the instantaneous pick-off voltage in line 22 reached the magnitude of the voltage in line 114, then the differential comparator 108 provides a set pulse in line 118 that flips the flip-flop 122 providing a one condition in lines 124, 26 and 106. The one or on condition in line 106 provides base drive to transistor 24, closing the transistor switch circuit 24 and providing a discharge path for the charge in capacitor 20 through the resistances 17, 18 and 19 and through line 25 and line 100 to ground 104. Additionally, the voltage rise of the output in line 26 provides an output pulse throug isolator 27 to output lines 28. The current in line 26 is limited by current limiting resistor 102. When capacitor 20 has discharged to a level that the minimum instantaneous voltage in line 23 becomes less than the voltage in line 116, then the differential comparator 110 provides a reset pulse in line 120 that flips the flip-flop 122 changing the voltage level in line 124 that de-energises transistor switch circuit 24, and again allows the charging of capacitor 20 by the half-wave voltage 41.

It should be understood that the measurement described is an integrating measurement, since capacitor 20 is integrating a current that is directly proportional to the instantaneous input voltage. This holds true except for the short period of time when switch 24 is turned on to discharge capacitor 20. It should also be understood that capacitor 20 operates at a very low voltage level, in that the voltage trigger points of pick-off lines 22 and 23 are set, for example, by the reference voltage in FIG. 2 to a relatively small differential voltage between the peak charge level on the capacitor 20 and the lower threshold discharge voltage in line 116. Thus there is a repetition rate of the output pulses from the V/F converter 21 to lines 28 for each half cycle period of the AC input voltage, because the rate of charge of capacitor 20 is directly proportional to the instantaneous input current. The converter output pulses in line 28 have a frequency modulated pattern that repeats for every half cycle of the unkown AC input voltage. When the input voltage crosses zero, the instantaneous voltage at that moment is zero, as there is no charging current in capacitor 20 at that moment. The converter also does not generate any output pulses at that time. Thereafter as the input voltage rises sinusoidally, the charging current into capacitor 20 increases and the converter generates output pulses whose repetition rate increases at a sinusoidal rate. The maximum repetition rate occurs at the peak of the AC input voltage when the charging current to the capacitor 20 is maximum. There after the repetition rate decreases. This cycle of events repeats over and over for each half cycle of the unknown AC input voltage.

The voltage being sensed by line 22 is not only the instantaneous voltage on capacitor 20, but also superimposed a portion of the rectified AC input voltage. The magnitude of the superimposed waveform can be adjusted by potentiometer 18. Thus, by superimposing an adjustable portion of the rectified input voltage, it is possible to modulate the integrator sense voltage and achieve perfect compensation for the effects of timing errors in the basic V/F converter. It was shown above that the timing error causes a negative deviation on conversion linearity. Therefore, in order to compensate for this error requires a positive, in-phase compensation, that is responsive to each instantaneous voltage level of the input voltage 41.

In FIG. 1, resistor 29 connects the rectified input voltage 41 to the base of transistor switch 30. Thus, base drive current is supplied as long as line 14 carries a voltage level of sufficient magnitude. However, the waveform 41 on line 14 is a train of rectified half waves. At the beginning and end of each half cycle, when the AC input voltage crosses the zero axis, there is a short transition period during which the voltage drops to zero and base drive is momentarily interrupted. As long as transistor 30 is turned on via base drive through resistor 29, it shunts the base of transistor 35 so that transistor 35 is turned off during that period. At zero crossing time, transistor 30 turns off and permits base drive from resistor 36 to transistor 35 which turns on momentarily. When transistor 35 turns on, it causes current to flow through resistor 37 and through the diode in the optical isolator 38. Thus, optical isolator 38 is momentarily activated during the zero crossing time of the input voltage. At that time, an isolated command is available on lines 39.

The purpose of this synchronizing pulse is to establish a time base for a conventional counter circuit. If the unknown input voltage has a fixed frequency such as the AC line voltage, it is possible to derive the counter time base from the zero crossing points of the input voltage. If the line voltage operates at 60Hz, there will be 120 zero crossings for each one second interval; and the time between successive zero crossings is approx. 8.33 ms. If component values are chosen for resistors 16, 17, 18 and 19 and capacitor 20 so that the V/F converter 24 will generate exactly 120 output pulses during each half-cycle period when the input voltage is exactly 120V, it is then only necessary to count the V/F output pulses with an 8.33 ms time base, synchronize the time to the line voltage zero crossings, and the count which is accumulated in the counter during each 8.33 ms (120 counts) can display directly the unknown input voltage. So the counter time base is derived directly from the zero crossings of the unknown input voltage.

The closing of transistor 35 also presets the charge on integrating capacitor 20 to exactly the same level at the beginning of each half cycle. This preset charge eliminates a one-digit quantizing error and improves the measurement accuracy. When transistor 35 turns momentarily on during the zero crossing time, it discharges capacitor 20 via diode 40. Diode 40 may be replaced by any suitable array which assures that capacitor 20 will always be preset to the same level. If this preset is omitted, it would introduce a one-digit quantizing error in the count. This quantizing error would occur because the instantaneous value of voltage on capacitor 20 can be anywhere between the two trip points of the V/F converter at the time when the input voltage approaches zero crossing i.e. at the very end of the previously measured half cycle.

The rectified half-waves on line 14 connect to a rectifier 31 in order to supply power for a power supply 32. This power supply provides regulated power for the V/F converter and the sync generator 130 and the total power required to operate all circuits is derived from the unknown AC input voltage. Power supply 32 may use conventional filter input capacitors to store energy at the peak of the AC waveform to provide carry-through energy for the power supply at the time when the AC input drops to a low level as it approaches zero crossing.

The V/F converter 21 operates through two sensing circuits to monitor the instantaneous voltage level on the integrating capacitor 20. The two sensing circuits monitor the integrating capacitor 20 via line 23, and line 22 monitors an adjustable point on potentiometer 18 which is part of the integrator resistor network. Discharge switch 24 connects via line 25 to a suitable point on the integrator resistor network so that a controlled, stable discharge period is maintained regardless of the repetition rate. The time constant of the discharge circuit is determined by the RC time constant of capacitor 20 and resistors 17, 18, 19. Depending on the actual value chosen for potentiometer 18, resistors 17 and 19 might be zero. The reason for potentiometer 18 and the sensing of two different points on the integrator network via lines 22 and 23 is to provide compensation for an inherent timing error that occurs in the basic V/F converter, and that causes an apparent linearity error if conversions are made over a wide dynamic range of input levels.

It should be understood that an integrating measurement of a rectified sine wave requires accurate, instantaneous conversions at any point of the sine wave between zero crossing and maximum peak voltage. The timing error of the basic V/F converter is simply a delay in response time from the instant when a sense line detects a critical trigger level until the corresponding switching action is actually accomplished. This delay in switching action causes the integrating capacitor to become charged and discharged beyond the predetermined trigger levels, and the magnitude of the net error is directly proportional to the ratio of time delay to the instantaneous V/F pulse period. This ratio is a non-lienar, sinusoidal function, having its most severe effect at the maximum peak voltage.

The compensating circuit provides an adjustment for sense line 22. Line 22 controls the trigger circuit which limits the peak charge on capacitor 20. When line 22 senses the critical level it fires a circuit which causes switch 24 to turn on, thus initiating the discharge of capacitor 20 through resistors 17, 18 and 19. Line 23 monitors capacitor 20 and controls the trigger circuit which determines the discharge level on capacitor 20. When line 23 senses the critical discharge level, it disables the same circuit that was previously fired by line 22. Thus, switch 24 turns off at that instant. The timing error causes a negative deviation of the conversion linearity; i.e. as the input voltage increases, the frequency of the V/F converter increases slightly less than directly proportional.

Thus, a new, integrating, AC voltage to frequency converter has been discribed in the above description of FIG. 2 which is capable of measuring AC voltages in discrete, half cycle intervals. If the frequency of the unknown input voltage is 60Hz, there are then 60 cycles per second which yield 120 half cycles per second. Of cours, this means that there will be 120 discrete measurements for each one second time interval. Unfortunately, the human eye cannot respond that fast so that it would be impossible for an observer to recognize a voltage transient of one half cycle duration—if the V/F output pulses were counted with a conventional counter and then displayed by a numeric readout. It would certainly be possible to print all readings with a high speed printer; but that would generate an unmanageable amount of printed paper and besides that, the cost of high speed printers is prohibitive. It should be obvious to anybody familiar in the state of the art that it would be easy to attach digital decoders to the counter output to initiate alarms or controls, or perhaps to record all measurements on temporary magnetic storage means for analysis and transcription. However, the common methods of recording, analysis and storage are not only expensive but also time consuming to review. Besides that, magnetically stored data requires additional, rather expensive equipment to convert the information back into a visible record or display.

Figure 3:
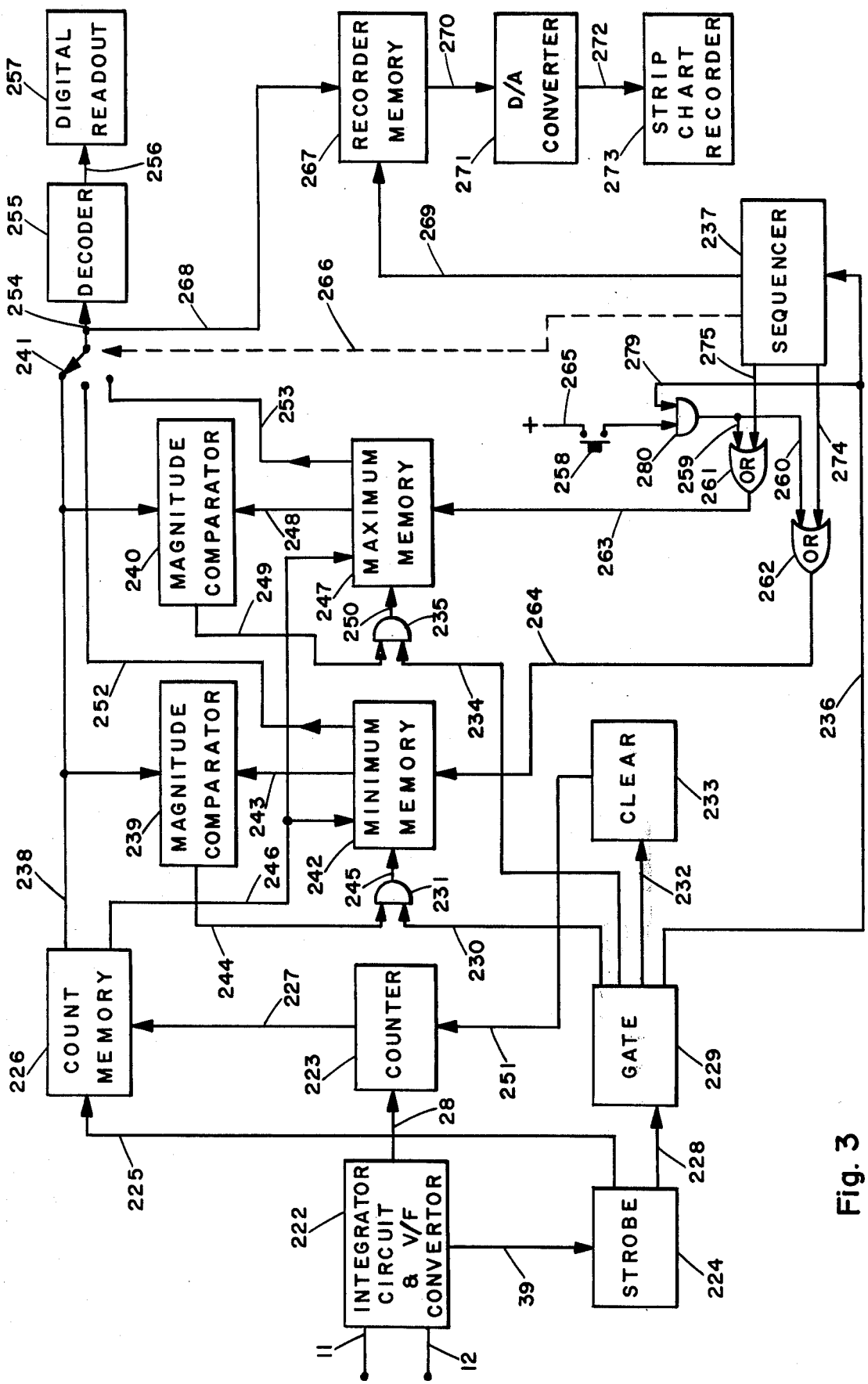
FIG. 3 is a block diagram of the integrating voltage to frequency converter and memory decoder of this invention.

It should be recalled at this time that the systems designer is looking for some very specific information about an unknown power line. He wants to know how stable the line voltage was during a given time interval such as perhaps one 8-hour work period. Secondly, he wants to know at what time line transients occurred, and he wants to know the aboslute magnitude of those transients. Of course, he must have measurements of the line voltage in half cycle increments, and he would like to see an easy to manage, written record which can be reviewed at one glance. A convenient method of recording might be a strip chart recorder with a paper advance speed of perhaps one inch per hour. In some other system, the designer may just be interested in knowing exactly how high the highest line transient was, and how low the lowest line voltage was during a given time period, as measured on a half cycle time base. Unfortunately, there is no inexpensive recorder available which would be capable of responding to half cycle (8 ms) transients. FIG. 3 shows a configuration of a high speed measurement circuit which is capable of analyzing each half cycle measurement, and which can memorize maximum and minimum values so that they may be recorded on an inexpensive, slow responding recorder.

In FIG. 3, the integrator circuit and V/F converter 222 has input lines 11 and 12 and output lines 28 and 39. The frequency pulses connect via line 28 to a counter 223, and the sync output connects via lines 39 to a strobe generator 224. It should be recalled here that the frequency pulses on line 28 are proportional to the instantaneous input voltage, and that the sync output on line 39 is a pulse which occurs every time the input AC voltage crosses the zero axis. Assume that information is stored in various memories as it was derived from a previous measurement and assume that the counter 223 has just started counting the frequency pulses which are connected via line 28. This is the begining of a half cycle. The frequency pulses on line 28 are rapidly changing in frequency as the input sine wave changes in amplitude and approaches zero. The counter 223 simply accumulates the count of V/F pulses during that half cycle.

When the input AC voltage approaches the zero axis, there will be no V/F converter pulses at that instant. Instead, a sync pulse is generated on output line 39. The sync pulse causes the generation of a strobe pulse in strobe generator 224. The strobe pulse connects via line 225 to a count memory 226. Counter 223 has a set of output lines 227 that represent digital output information that also connects to count memory 226. The strobe pulse on line 225 is a command to the count memory 226 so that the count memory 226 will now store the information that was presented on line 227. Strobe generator 224 has a second output connected via line 228 to a gate generator 229. The gate 229 is a pulse generator and its timing is such that it generates the gate pulse just a brief moment after the strobe pulse. The gate pulse connects via four output lines into four separate circuits. Line 230 connects to gate 231, line 232 connects to a "Clear" pulse generator 233, line 234 connects into a gate 235, and line 236 connects to a sequencer 237 and gate 280. The count memory 226 has a set of output lines 238 that present digital output information to two magnitude comparators 239 and 240 and to a selector switch or electronic switching circuit 241.

When count memory 226 is strobed by the strobe pulse in line 225, it stores the count that is presented on the set of lines 227. Thus, the count that was accumulated during the just completed half cycle is now transferred and stored in count memory 226. The stored information is then presented to the two known magnitude comparators 239 and 240. Comparator 239 weighs the number of lines 238 against a number that was stored from some previous measurement in the minimum memory 242. The number that was stored in the minimum memory 242 is presented to the magnitude comparator 239 via a set of lines 243. If the number on lines 238 is smaller than the number on lines 243, it means that the just completed half cycle had a lower measurement than the previously store lowest reading. If this is the case, the magnitude comparator 239 will then generate a logic command on line 244 that connects into the AND gate 231. The output of gate 231 connects via line 245 to the minimum memory 242, where it commands the minimum memory to erase the previously stored number and stores now the latest measurement that is presented from count memory 226 via a set of lines 246. This command can only occur during the gate period of gate 229, which is during the zero crossing time.

Thus, each half cycle measurement is first of all stored in a count memory 226 and then it is processed in a magnitude comparator that compares the very latest measurement against a memory 242 which is storing the lowest voltage reading that had occurred prior to the just completed measurement. If the just completed measurement is lower than the previously memorized lowest voltage, it will then be stored in the minimum memory 242 as the absolute lowest reading thus far. On the other hand, if the just completed measurement is higher than the stored measurement in the minimum memory 242, it is simply ignored, i.e. no gate command is generated on line 245.

At the same time that the measurement is processed in the minimum magnitude comparator 239, it is also processed in a maximum comparator 240. This is done in the following manner. The output of count memory 226 connects via the set of output lines 238 to a magnitude comparator 240. This comparator 240 weighs the just completed measurement against a number that was previously stored in a maximum memory 247. The maximum memory 247 output connects via a set of lines 248 to the magnitude comparator 240. If the just completed measurement is larger than the previously stored largest voltage, a command will be generated on line 249 that connects to AND gate 235 and causes a logic command on line 250 to strobe the maximum memory 247. The maximum memory 247 will then erase the previously stored number and store instead of the number that is presented to it on lines 246, which is the just completed measurement.

At the same time when the gate pulse occurs in lines 230 and 234, there is also a pulse generated on line 232. This generates a clear command from the clear circuit 233, that connects via line 251 to the counter 223. This clear command causes the counter 223 to reset to zero so that it is ready to start a new count. The whole sequence of strobe 224, gate 229, and clear 233, occurs in an orderly sequence, but all during the brief moment when the unknown AC voltage crosses the zero axis. Thus, there has been a measurement of an unknown AC voltage in half cycle increments, and the analyzing of each measurement by comparing it against minimum and maximum memories so that the maximum highest, as well as the minimum lowest voltage during a given time period can be measured and memorized.

The display in a digital readout 257 is accomplished as follows. A selector switch 241, that may be a known arrangement of switching gates, permits access to the count memory 226 via line 238 to the minimum memory 242 via line 252 to the maximum memory 247 via line 253. The selected memory connects then via line 254 to a decoder 255, and the decoded output energizes a digital display 257 through line 256. Thus, by switching the selector 241 to any one of its three input positions, it is then possible to display in the digital readout 257 either the maximum voltage or the minimum voltage that existed during a given time period; or the display can also show the instantaneous, on-line voltage by selecting line 238, which is the count memory that stores each half cycle measurement during the period of the next following half cycle. At any time when it is desired, it is possible to erase the maximum and minimum memories by a pushbutton command. Pushbutton 258 connects via line 265 to some suitable supply voltage and when activated in coordination with the gating of AND gate 280 by a pulse received from gate 229 through lines 236 and 279, supplies a logic input to OR gates 261 and 262. The outputs of these gates supply a reset command to maximum memory 247 via line 263, and from gate 262 via line 264 to the minimum memory 242. The forced pushbutton reset 258 must be synchronized with the zero crossing of the unknown AC input voltage that is being measured.

Strip chart recording can be achieved in the following manner. A known sequencer circuit 237 is operating the selector circuit 241 to switch periodically back and forth between input lines 252 and 253. The sequence of this switching back and forth occurs at any convenient rate, such as once every minute. However, whenever the switch-over to the other line is programmed it is then synchronized so that it occurs at the zero voltage crossing. This synchronization is achieved by a gated pulse via line 236 from the gate 229. The sequencer 237 electrically controls the switching circuit 241 via line 266. A recorder memory 267 is strobed by the sequencer 237 via line 269 so that it will store the selected digital information that is presented to the memory via line 268. The output of the recorder memory 267 connects via line 270 to a digital-to-analog converter (D/A) 271. The D/A 271 converts the digital input into an analog output that is suitably connected to a strip chart recorder 273 in a known manner via lines 272. The sequencer 237 also has two output lines 274 and 275 that connect into the OR gates 261 and 262. As previously described, these two gates command a reset to the minimum and maximum memories 242 and 247.

The sequencer circuit 237 may comprise a dual timer, N556 or two N555 circuits. One timer, for example, may be set to run for approximately one minute and it then turns on the second timer that operates for about a milli-second. The second timer provides all of the command outputs. The sequencer is programmed to switch periodically back and forth between minimum and maximum memories. Just before the selector switch 241 switches, the recorder memory 227 is strobed via line 269, and immediately after the strobing, a reset command is generated which resets that particular memory 242 or 247 to which switch 241 was connected at the time when the recorder memory 267 was strobed.

If it is assumed that if switch 241 is programmed to switch once every minute, the system would then yield a recording on the strip chart recorder that shows alternating—in one minute intervals—maximum voltage and minimum voltage of each of the preceding two minute interval. In other words, the strip chart recorder 263 is used on a time sharing basis. Although the information on the slow writing recorder 273 is greatly compressed, it represents the worst case conditions of individual reasurements that were made over incremental, half cycle time periods. At the same time, the strip chart recorder provides a written record of exactly what the worst case conditions have been.

The individual circuit components are known circuit elements. As examples, the following is a list of applicable known circuit components.

Each of the minimum and maximum memories and other memories can be quadruple bistable latches, N 7475.

The magnitude comparators are N 7485's.
The counters are N 7490.
The clear circuit and the gate circuits are one shots.
Having described my invention, I now claim:

1. An integrating voltage to frequency converter and memory decoder for determining the occurrence of maximum or minimum voltages of input cyclic line voltages for selected time periods, comprising:
   rectifier means for rectifying input cyclic line voltages to rectified half-waves,
   voltage to frequency converter means for converting said half-waves to pulses, which pulses are proportional in number to the integrated voltage of said half-waves,
   strobe means for providing a strobe pulse at zero voltage levels of said half-waves,
   counter means responsive to said strobe pulses and said pulses for counting said pulses for each half-wave,
   comparison memory means for making maximum or minimum comparisons of pulse counts in said counter means for successive half-waves and storing the maximum or minimum counts occurring over a given number of half-waves,
   and decoder means for decoding the maximum or minimum counts to maximum or minimum voltage levels.

2. An integrated voltage frequency converter and memory decoder as claimed in claim 1, including,
   said comparison memory means comprising a maximum count memory and a minimum count memory,
   and said decoding means including switch means for selectively interrogating said maximum memory and said minimum memory.

3. An integrating voltage to frequency converter and memory decoder as claimed in claim 2 including,
   display means responsive to the output of said decoding means for displaying the maximum or minimum voltage levels.

4. An integrating voltage to frequency converter and memory decoder as claimed in claim 3 including,
   count memory means for storing the pulse count of said counter means for each half cycle,
   and magnitude comparator means for comparing a given count in said count memory means with the maximum and minimum counts in said maximum and minimum count memories and updating the count in said maximum and minimum count memories when the count in said count memory means is smaller than the count in said minimum count memory or larger than the count in the maximum count memory.

5. An integrating voltage to frequency converter and memory decoder as claimed in claim 4 wherein,
   said decoder switch means includes means for interrogating the current count in said count memories means.

6. An integrating voltage to frequency converter and memory decoder as claimed in claim 5 including,
   time sequencer means for providing output control pulse at given time sequences,
   said decoder switch means responsive to said time sequencer means for selectively interrogating the minimum count memory and the maximum count memory,
   an recorder means for recording the particular counts in said minimum count memory or said maximum count memory at the time of said interrogation.

7. An integrating voltage to frequency converter and memory decoder as claimed in claim 6, wherein:
   said sequencer means having means for selectively resetting said minimum count memory and said maximum count memory at the time said sequencer initiates said decoding switch means to interrogate said respective minimum count memory and maximum count memory.

8. An integrating voltage to frequency converter and memory decoder as claim in claim 7, including,
   means responsive to said strobe pulses for clearing said count memory means and said count means a each zero voltage condition of the half-wave voltage input.

9. An integrating voltage to frequency converter and memory decoder as claimed in claim 8, wherein,
   said voltage to frequency converter means includes resistor means connected between a capacitor means and said rectifier means for charging said capacitor means with said half-wave voltages,
   voltage-frequency converter means responsive to the voltage build up in said capacitor means for providing serial output pulses proportional in total number over the time period of each of said half-wave voltages to the rms magnitude of the half-wave voltages, first tap means on said resistor means for monitoring the voltage level at a first node in said resistor means that is proportional to the difference between the instantaneous voltage on said capacitor means and said half-wave voltages for feeding the voltage at said first node to said voltage-frequency converter means, switch circuit means in parallel with said capacitor means for discharging said capacitor means when said voltage at said first node exceeds a given magnitude, and means for selectively varying the magnitude of the voltage at said first node relative to the voltage on the capacitor means to reduce pulse timing errors in the voltage-frequency converter means.

10. An integrating voltage to frequency converter and memory decoder as claimed in claim 9, wherein, said means for selectively varying comprises a potentiometer means as part of said resistor means.

11. An integrating voltage to frequency converter and memory decoder as claimed in claim 10, including, second tap means on said resistor means for monitoring the voltage at a second node in said resistor means, and means for detecting when the voltage at said second node is below a given magnitude and providing an output pulse for opening said switch circuit means.

12. An integrating voltage to frequency converter and memory decoder as claimed in claim 11, wherein, said first and second nodes are spaced by a portion of the resistance of said potentiometer means.

13. An integrating voltage to frequency converter and memory decoder as claimed in claim 12, including, second discharge switch circuit means for discharging said capacitor means substantially instantaneously, and zero voltage crossing detector means for detecting when said half-waves are at a substantially zero voltage and providing an output pulse that closes the second discharge switch circuit means discharging said capacitor means to a given charge condition instantaneously when said half-waves are at a substantially zero voltage irrespective of the charge condition on said capacitor means at the time of zero voltage.

14. An integrating voltage to frequency converter for providing output pulse counts proportional to the integrated voltage of half-waves of cyclic line voltage rectified to the half-waves, comprising, rectifier means for rectifying input cyclic line voltages to said half-waves;

resistor means connected between a capacitor means and said rectifier means for charging said capacitor means with said half-wave voltages, voltage-frequency converter means responsive to the voltage built up in said capacitor means for providing serial output pulses proportional in total number over the time period of said half-wave voltages to the rms magnitude of the half-wave voltages, first tap means on said resistor means for monitoring the voltage level at a first node in said resistor means that is proportional to the difference between the instantaneous voltage on said capacitor means and said half-wave voltages for feeding the voltage at said first node to said voltage-frequency converter means, switch circuit means in parallel with said capacitor means for discharging said capacitor means when said voltage at said first node exceeds a given magnitude, and means for selectively varying the magnitude of the voltage at said first node relative to the voltage on the capacitor means to reduce pulse timing errors in the voltage-frequency converter means.

15. An integrating voltage to frequency converter and memory decoder as claimed in claim 14, wherein, said means for selectively varying comprises a potentiometer means as part of said resistor means.

16. An integrating voltage to frequency converter and memory decoder as claimed in claim 15, including, second tap means on said resistor means for monitoring the voltage at a second node in said resistor means, and means for detecting when the voltage at said second node is below a given magnitude and providing an output pulse for opening said switch circuit means.

17. An integrating voltage to frequency converter and memory decoder as claimed in claim 16, wherein, said first and second nodes are spaced by a portion of the resistance of said potentiometer means.

18. An integrating voltage to frequency converter and memory decoder as claimed in claim 17, including, second discharge switch circuit means for discharging said capacitor means substantially instantaneously, and zero voltage crossing detector means for detecting when said half-waves are at a substantially zero voltages and providing an output pulse that closes the second discharge switch circuit means discharging said capacitor means to a given charge condition instantaneously when said half-waves are at a substantially zero voltage irrespective of the charge condition on said capacitor means at the time of zero voltage.

19. The method of determining by half-wave cycles the minimum or maximum voltage levels of an input cyclic line voltage over a given period of time, comprising the steps of, rectifying the input cyclic line voltage to rectified half-waves, converting the half-waves to pulses that are proportional in number to the integrated voltage of the half-waves, providing a strobe pulse at the zero voltage level of each of said half-waves, counting the pulses for each half-wave and starting a new count in response to strobe pulses from the zero voltage levels of the half-waves, making maximum and minimum comparisons of the pulse counts in the counter means for successive half-waves and storing the maximum or minimum counts occuring over a given number of half-waves, decoding the maximum or minimum counts to voltage levels, and displaying the voltage levels.

20. A method of providing output pulse counts that are accurately proportional to the integrated voltage of half-waves of cyclic line voltages rectified to half-waves, comprising the steps of, storing the half-wave voltages in a integrating resistence network and capacitor circuit, providing serial output pulses proportional in number to the magnitude of the integrated voltage build up in the capacitor circuit, monitoring the voltage level at a given pick-off point in the integrating resistance network to obtain a pick-off voltage, which voltage level is proportional to the instantaneous charge in the integrating capacitor circuit, feeding the pick-off voltage to a voltage-frequency converter means, discharging the accumulated charge in the capacitor circuit when the pick-off voltage exceeds a given magnitude, and selectively varying the magnitude of the pick-off voltage relative to the instantaneous charge in the integrated capacitor circuit to reduce pulse timing errors in the voltage-frequency converter means.

21. The method of providing output pulse counts as claimed in claim 20, including the steps of, discharging the capacitor circuit through the integrated resistance network to a given charge level in the capacitor circuit.

22. The method of providing output pulse counts as claimed in claim 21, including the steps of, sensing the zero voltage condition of the half-wave voltages and providing an output signal, and closing a second circuit for discharging the capacitor circuit instantaneously in response to the output signal.

* * * * *